(12) United States Patent
Yoshida et al.

(10) Patent No.: US 8,105,005 B2
(45) Date of Patent: Jan. 31, 2012

(54) ARTICLE TRANSPORT FACILITY

(75) Inventors: Mitsuru Yoshida, Higashiomi (JP); Yoshitaka Inui, Omihachiman (JP)

(73) Assignee: Daifuku Co., Ltd., Osaka (JP)

( * ) Notice: Subject to any disclaimer, the term of this patent is extended or adjusted under 35 U.S.C. 154(b) by 738 days.

(21) Appl. No.: 12/041,965

(22) Filed: Mar. 4, 2008

(65) Prior Publication Data

US 2008/0219825 A1   Sep. 11, 2008

(30) Foreign Application Priority Data

Mar. 7, 2007   (JP) .................. 2007-057209

(51) Int. Cl.
    *B65G 1/00* (2006.01)
(52) U.S. Cl. ............... 414/282; 414/940; 212/332
(58) Field of Classification Search .............. 414/266, 414/278, 277, 282, 626, 373, 940; 212/331, 212/332
    See application file for complete search history.

(56) References Cited

U.S. PATENT DOCUMENTS

| 6,009,890 | A | 1/2000 | Kaneko et al. |
| 7,780,020 | B2 * | 8/2010 | Yoshitaka ............... 212/332 |
| 2004/0109746 | A1 | 6/2004 | Suzuki |
| 2007/0059131 | A1 | 3/2007 | Yoshitaka |

FOREIGN PATENT DOCUMENTS

| DE | 10 2006 036 095 A1 | 3/2007 |
| EP | 0 854 499 B1 | 7/1998 |
| JP | 2-135513 U | 11/1990 |
| JP | 10-45213 | 2/1998 |
| JP | 10-109887 | 4/1998 |
| JP | 2004-189018 A | 7/2004 |
| JP | 2006-54389 | 2/2006 |
| WO | 03/088350 A1 | 10/2003 |

* cited by examiner

*Primary Examiner* — Joshua Rudawitz
(74) *Attorney, Agent, or Firm* — The Webb Law Firm

(57) ABSTRACT

An article transport facility includes an article carrier movable along a track, and an article rack arranged along the track. Each article rack has a fixed frame, and a movable frame supported to be movable relative to said fixed frame between an extended position projecting toward the track and a retracted position retracted away from the track. A movable guide shiftably supports and guides the movable frame to be movable relative thereto in a shifting direction. A fixed guide is mounted on the fixed frame for supporting and guiding the movable guide to be movable in the shifting direction.

9 Claims, 13 Drawing Sheets

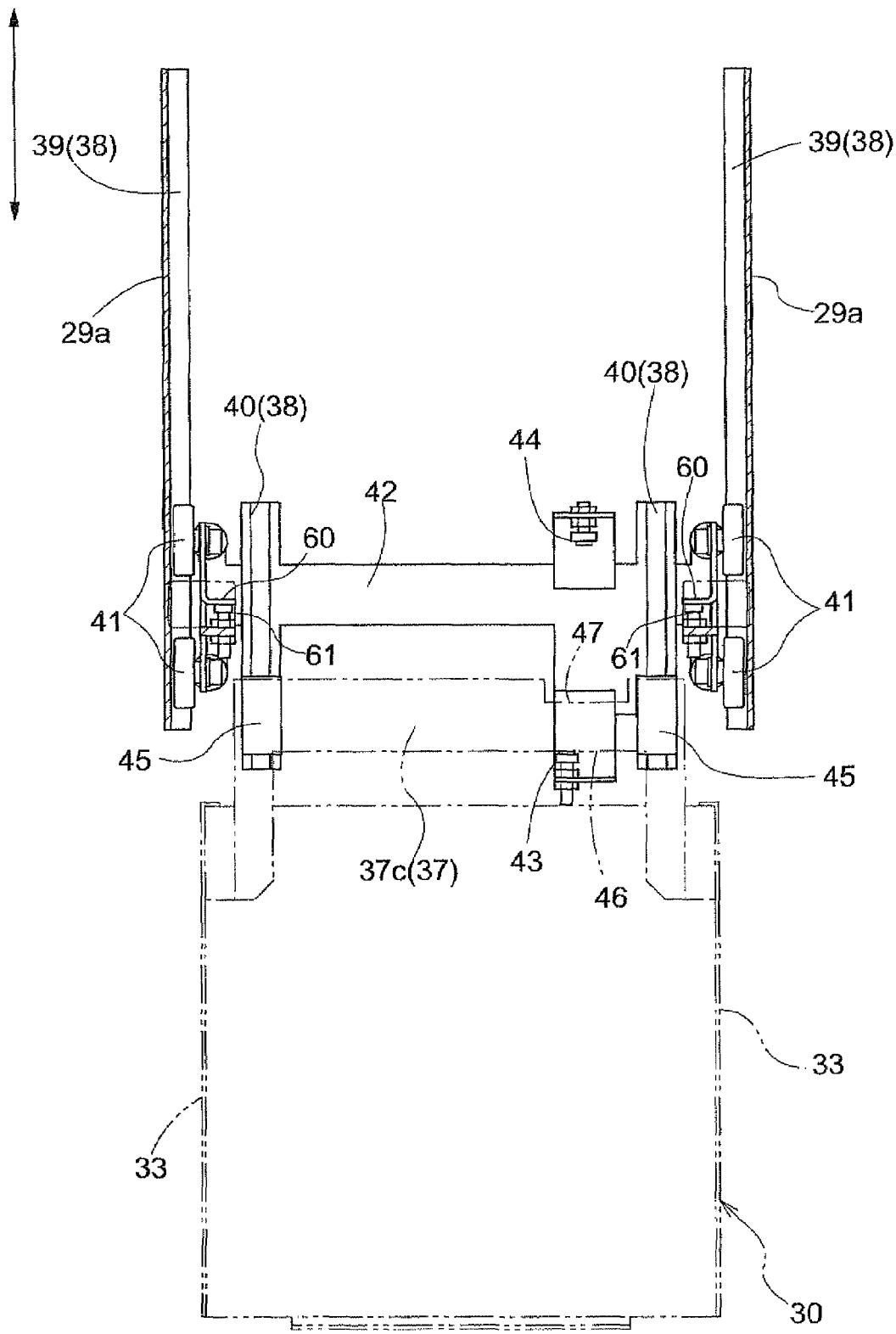

ARTICLE TRANSPORT FACILITY

BACKGROUND OF THE INVENTION

This invention relates to an article transport facility, and more particularly to an article transport facility including an article carrier movable along a track extending by way of an article transfer location corresponding to a storage rack.

Such an article transport facility includes a plurality of article transfer stations arranged along the track. The article carrier moves along the track to transport articles between the stations.

Article racks are provided to store temporarily articles to be transported to the stations. Each article rack is usually located in a retracted position away from the track, not to interfere with movement of the article carrier. The article rack is shifted from the retracted position to an extended position projecting toward the track when an article is stored on the article rack or when an article stored on the article rack is transported therefrom. Then, the article is transferred to or from the article rack.

A conventional article transport facility has a guide rail serving as the track installed on the ceiling. A link mechanism is connected at an upper end thereof connected to the ceiling to be rockable about a horizontal axis for supporting each article rack to be shiftable between the extended position and retracted position. A hydraulic cylinder is disposed between the ceiling and the link mechanism for shifting the article rack between the extended position and retracted position (see JP 10-45213, for example).

In the above article transport facility, the article racks may be arranged back to back adjacent one another in the shifting direction of the article racks, or the article racks and other devices may be arranged adjacent one another in the shifting direction of the article racks. Thus, the installation space for the article racks is required to be as small as possible in the shifting direction of the article racks.

In the conventional article transport facility, however, since each article rack is shifted between the extended position and retracted position by rocking the link mechanism in the shifting direction of the article rack about the horizontal axis, a large space must be secured for allowing the link mechanism to rock in the shifting direction of the article rack. This results in a large installation space of components for shifting the article rack in its shifting direction. Thus, the conventional article transport facility tends to require a large installation space for the article racks in the shifting direction of the article racks.

It is conceivable that the components for shifting the article rack include a fixed guide for supporting and guiding the article rack to be shiftable in the shifting direction. However, in this case also, the fixed guide is required to have a sufficient size for allowing the article rack to shift between the extended position and retracted position. Thus, the fixed guide tends to require a large installation space in the shifting direction of the article rack.

SUMMARY OF THE INVENTION

The object of this invention is to provide an improvement on the prior art noted above.

An article transport facility according to this invention comprises:
an article carrier movable along a track;
an article rack arranged along said track, said article rack having a fixed frame, and a movable frame supported to be movable relative to said fixed frame between an extended position projecting toward said track and a retracted position retracted away from said track;
said article carrier being configured to stop in an article transfer location for said article rack and to deliver an article to and receive an article from said article rack when said movable frame is in said extended position;
a movable guide for shiftably supporting and guiding said movable frame to be movable relative thereto in a shifting direction; and
a fixed guide mounted on said fixed frame for supporting and guiding said movable guide to be movable relative thereto in said shifting direction.

When the movable frame projects from the retracted position to the extended position, the movable guide will move relative to the fixed guide in the shifting direction of the movable frame toward the extended position, and the movable frame will move relative to the movable guide in the shifting direction of the movable frame toward the extended position. When the movable frame retracts from the extended position to the retracted position, the movable frame will move relative to the movable guide in the shifting direction of the movable frame toward the retracted position, and the movable guide will move relative to the fixed guide in the shifting direction of the movable frame toward the retracted position. Thus, when the movable frame is shifted between the extended position and retracted position, the movable guide moves in the shifting direction of the movable frame relative to the fixed guide. The fixed guide can be reduced in size by a corresponding amount in the shifting direction of the movable frame. Moreover, the fixed guide and movable guide may be overlapped in the shifting direction of the movable frame when the movable frame is in the retracted position.

In the shifting direction of the movable frame, only an installation space for the fixed guide may be secured as an installation space for components for shifting the movable frame. Thus, the article transport facility provided can minimize the installation space of the article rack in the shifting direction of the movable frame.

In an embodiment, the article transport facility, preferably, further comprises a shift control device mounted on said article carrier for shifting said movable frame between said extended position and said retracted position when said article carrier is in said article transfer location.

The article transport facility in an embodiment, preferably, further comprises:
an operated element rockable about a pivot axis to switch between a proximate position close to said article carrier in said article transfer location and a remote position remote from said article carrier in said article transfer location;
said shift control device has an operating element movable away from said article carrier to switch said operated element from said proximate position to said remote position, and movable back toward said article carrier to switch said operated element from said remote position to said proximate position; and
a rocking link operatively connected to said operated element and rockable in said shifting direction of said movable frame about a rocking axis such that said movable frame is in said retracted position when said operated element is in said proximate position, and said movable frame is in said extended position when said operated element is in said remote position;
said rocking link having an engaging portion in slidable engagement with an engaged portion formed in said article rack and extending in a direction perpendicular to said shifting direction.

In the article transport facility in an embodiment, preferably, said article carrier is movable along said track disposed above said article racks, and includes an article holder vertically movable to deliver an article to and receive an article from said article rack.

In the article transport facility in an embodiment, preferably, said movable guide is engaged with a slide member connected to said movable frame, one of said movable guide and said slide member having a recessed section, and the other of said movable guide and said slide member having a projecting section.

BRIEF DESCRIPTION OF THE DRAWINGS

FIG. 13 is a plan view of a principal portion of the article rack.

DETAILED DESCRIPTION OF PREFERRED EMBODIMENTS

An article transport facility according to this invention will be described with reference to the drawings.

Figure 1:
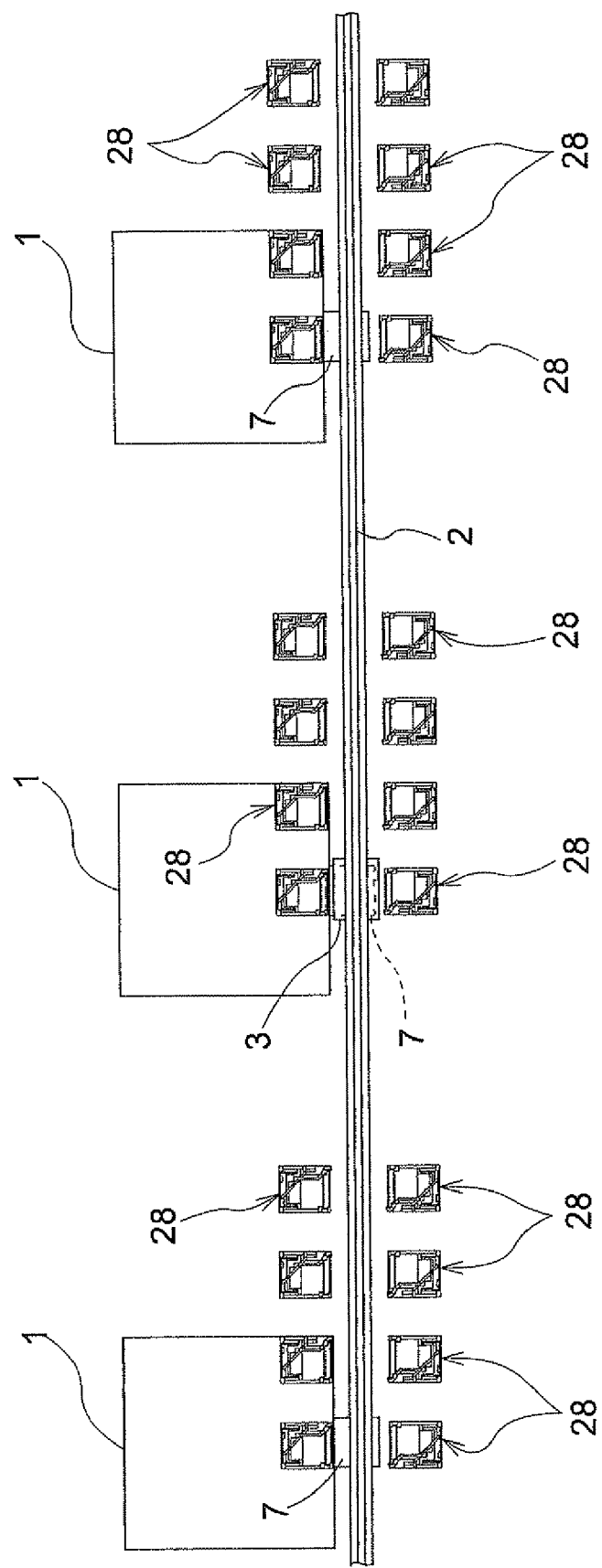
FIG. 1 is a plan view of an article transport facility.
Figure 2:
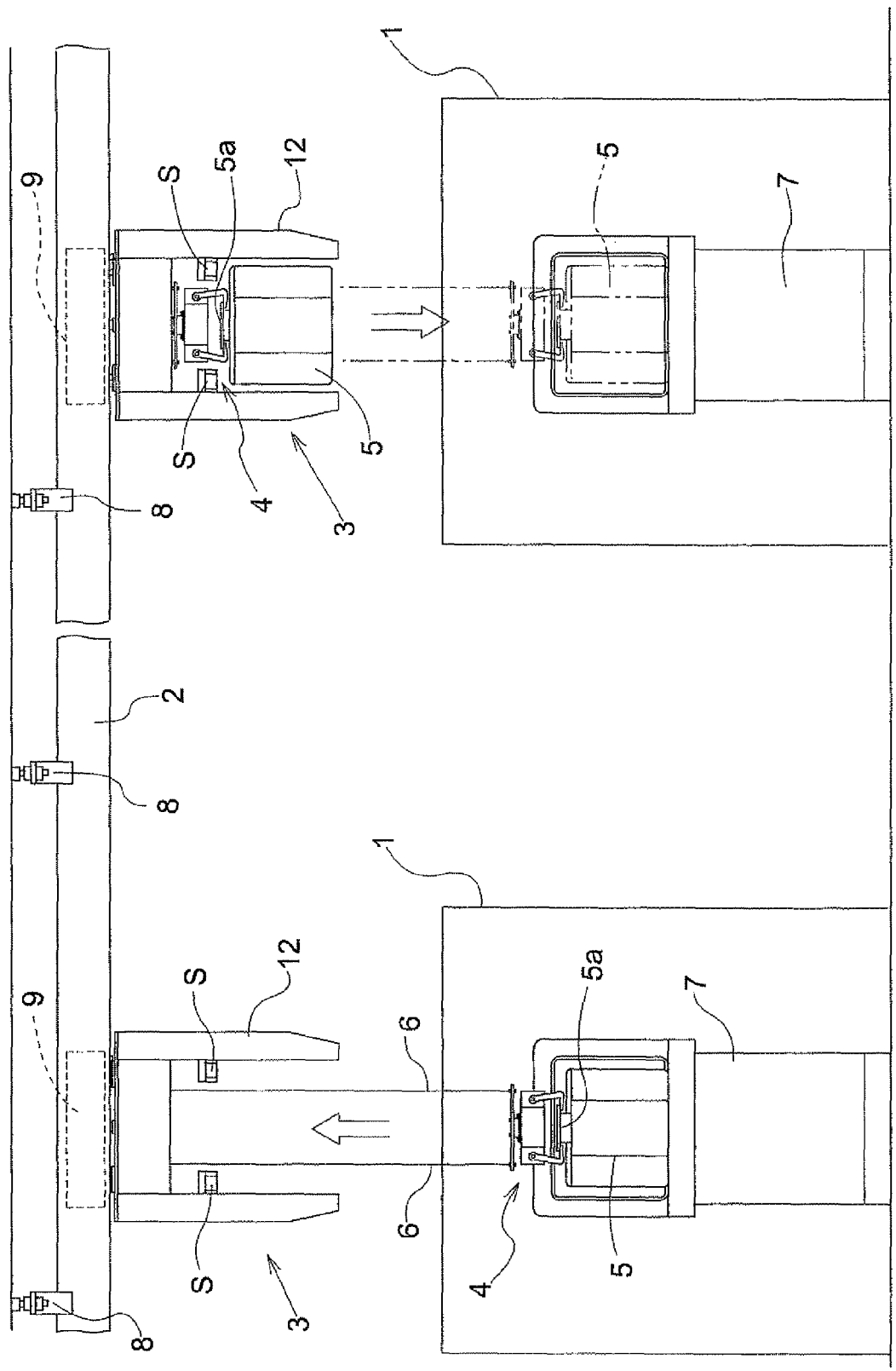
FIG. 2 is a side view of a transport vehicle and a station.

As shown in FIGS. 1 and 2, the article transport facility includes a guide rail 2 installed as a track extending by way of a plurality of article processing units 1, and a transport vehicle 3 acting as an article carrier movable along the guide rail 2. The transport vehicle 3 transports containers 5 acting as articles storing semiconductor substrates between the plurality of article processing units 1. Each article processing units 1 performs a predetermined process for partly finished goods in the course of manufacturing semiconductor substrates, for example.

The transport vehicle 3 has a vertically movable article gripper 4 for holding a container 5 in a suspended state. With the transport vehicle 3 standing still, the gripper 4 is vertically movable, by winding and unwinding wires 6, between an upper position adjacent the transport vehicle 3, and a lower position for article transfer to and from article transfer stations 7 disposed below the transport vehicle 3.

FIG. 2 shows the gripper 4 being lowered from the upper position to the lower position at the upper side, and the gripper 4 being raised from the lower position to the upper position at the lower side.

Each station 7 is in the form of a support table for supporting containers 5. The station 7 serves to receive containers 5 from the transport vehicle 3 for a predetermined process by the article processing unit 1, or to deliver containers 5 having undergone the predetermined process by the article processing unit 1 to the transport vehicle 3. The station 7 is provided for each of the article processing units 1.

The transport vehicle 3 moves along the guide rail 2, with the gripper 4 placed in the upper position. With the transport vehicle 3 stopped in a stopping position corresponding to a station 7 among the plurality of stations 7, a container 5 is transferred to or from this station 7 by vertically moving the gripper 4 between the upper position and the lower position.

Figure 3:
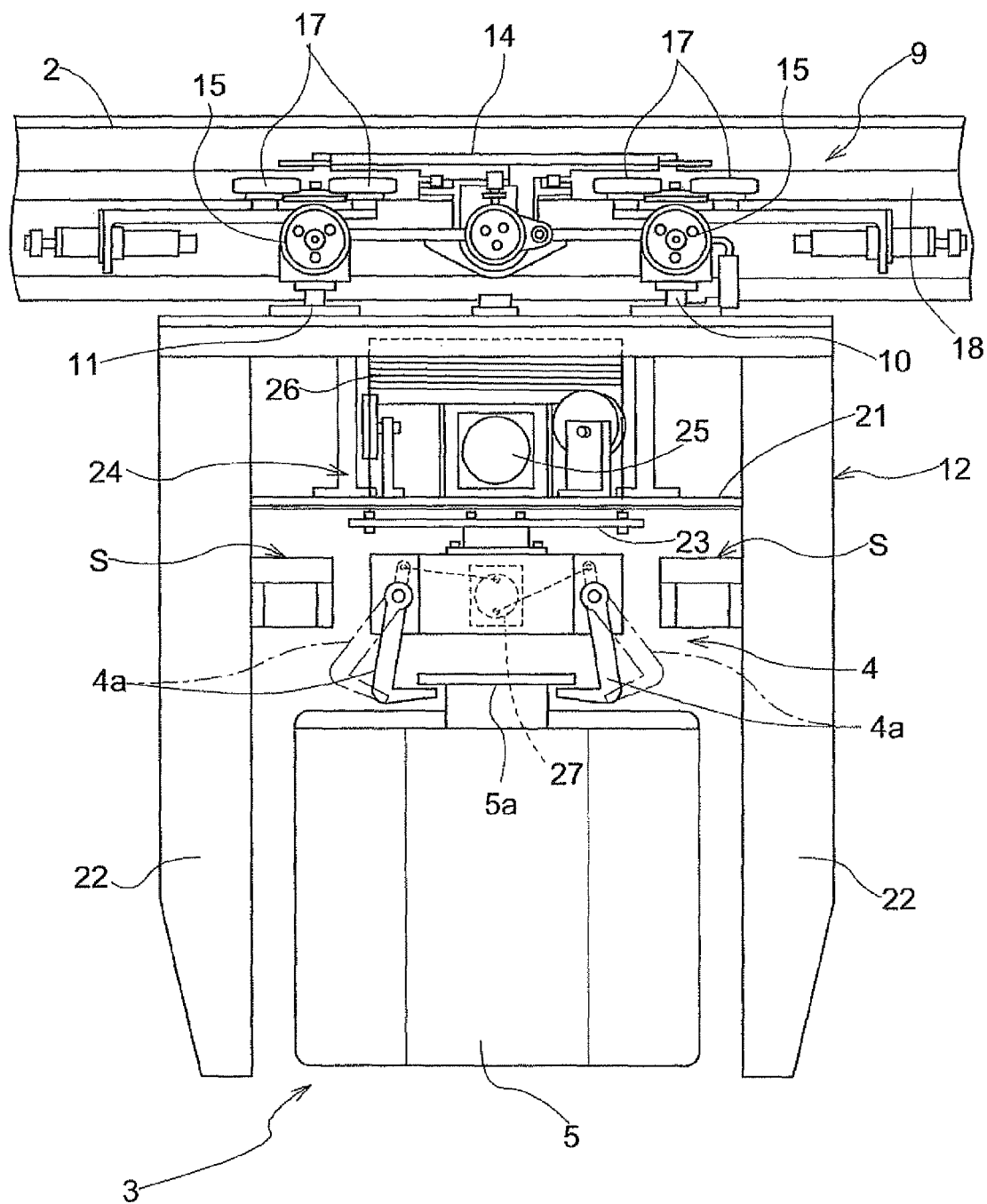
FIG. 3 is a side view of the transport vehicle.
Figure 4:
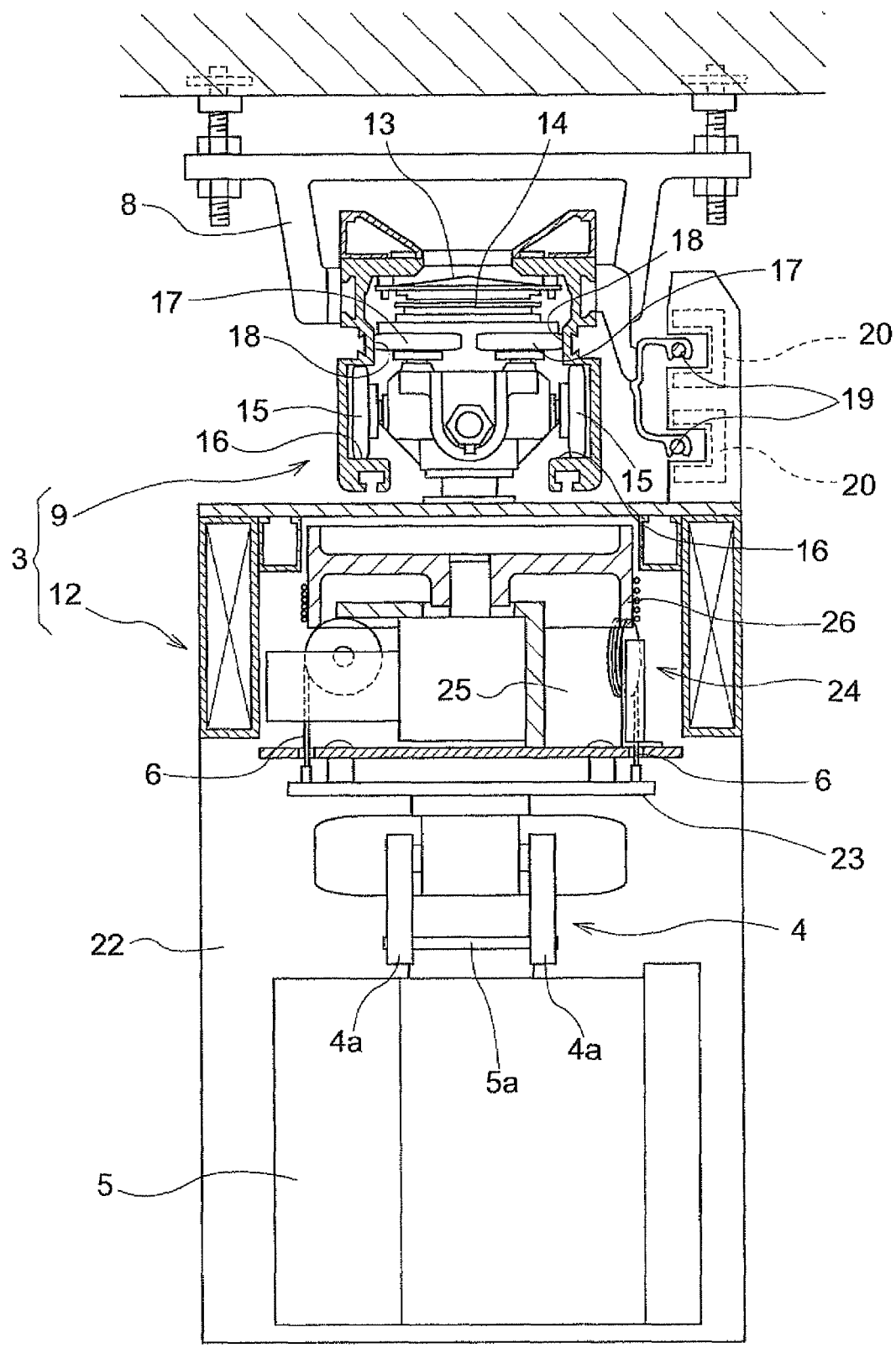
FIG. 4 is a front view in vertical section of the transport vehicle.

As shown in FIGS. 2 through 4, the guide rail 2 is fixed to a ceiling by guide rail brackets 8. The transport vehicle 3 includes an upper vehicle body 9 located in an inner space of the guide rail 2, and a lower vehicle body 12 located under the guide rail 2, which are connected together by fore and aft connecting rods 10 and 11.

The upper vehicle body 9 has a primary coil 14 disposed close and opposite to a magnet 13 mounted in the inner space of the guide rail 2. The upper vehicle body 9 is the linear motor type propelled by a linear motor formed of the magnet 13 and primary coil 14. The transport vehicle 3 is movable along the guide rail 2 by this propelling force.

In the inner space of the guide rail 2, running guideways 16 are formed for guiding running wheels 15 of the upper vehicle body 9, and anti-swing guideways 13 for guiding anti-swing wheels 17 of the upper vehicle body 9.

The guide rail 2 has feeder lines 19, and the upper vehicle body 9 has receiving coils 20. The feeder lines 19 supplied with AC generate magnetic fields, which cause the receiving coils 20 to generate power required by the transport vehicle 3. Thus, power is supplied in a non-contact mode.

In this embodiment, the mode for driving the upper vehicle body 9 is the linear motor type that obtains propelling force from a linear motor. Alternatively, for example, an electric motor may be provided for rotating the running wheels 15, and the upper vehicle body 9 may be driven by rotating the running wheels 15 with the electric motor.

The lower vehicle body 12 includes a fore and aft frame 21 extending in the fore and aft direction of the transport vehicle 3, and a pair of front and rear vertical frames 22 extending downward from a forward end and a rearward end of the fore and aft frames 21. The lower vehicle body 12 is channel-shaped opening downward in side view, with the gripper 4 disposed at the middle in the fore and aft direction.

The gripper 4 is attached to a lift member 23 vertically movable relative to the upper vehicle body 9. The lift member 23 is supported to be vertically movable by a lift control mechanism 24 attached to the fore and aft frame 21.

The lift control mechanism 24 has four wires 6 wound around a rotating drum 26 rotatable by a drum driving motor 25. The lift control mechanism 24 rotates the rotating drum 26 forward and backward to wind and unwind the four wires 6 simultaneously, thereby moving the lift member 23 up and down while maintaining the lift member 23 in a substantially horizontal position.

Although this embodiment shows the example of winding the wires 6 around the rotating drum 26, the lift member 23 may be vertically moved, for example, by belts wound around the rotating drum 26. Thus, the wires 6 may be replaced with belts. The wires and belts are called flexible elements.

The gripper 4 includes a pair of gripping elements 4a for gripping a flange 5a of each container 5. The pair of gripping elements 4a are switchable, with forward and backward rotations of a gripping motor 27, between a gripping position for gripping the flange 5a by the gripping elements 4a rocking toward each other (solid lines in FIG. 3) and a release position for releasing the flange 5a by the gripping elements 4a rocking away from each other (dotted lines in FIG. 3).

The gripper 4 is attached to the lift member 23 to be swivelable about a vertical axis. Though not shown, a swivel motor is provided for swiveling the gripper 4.

In order to keep temporarily the containers 5 transported to the stations 7, as shown in FIG. 1, a plurality of article racks 28 for article storage are arranged adjacent and at both sides of the guide rail 2. These article racks 28 are arranged along the guide rail 2.

The article racks 28 will be described hereinafter with reference to FIG. 5 through 10.

Figure 6:
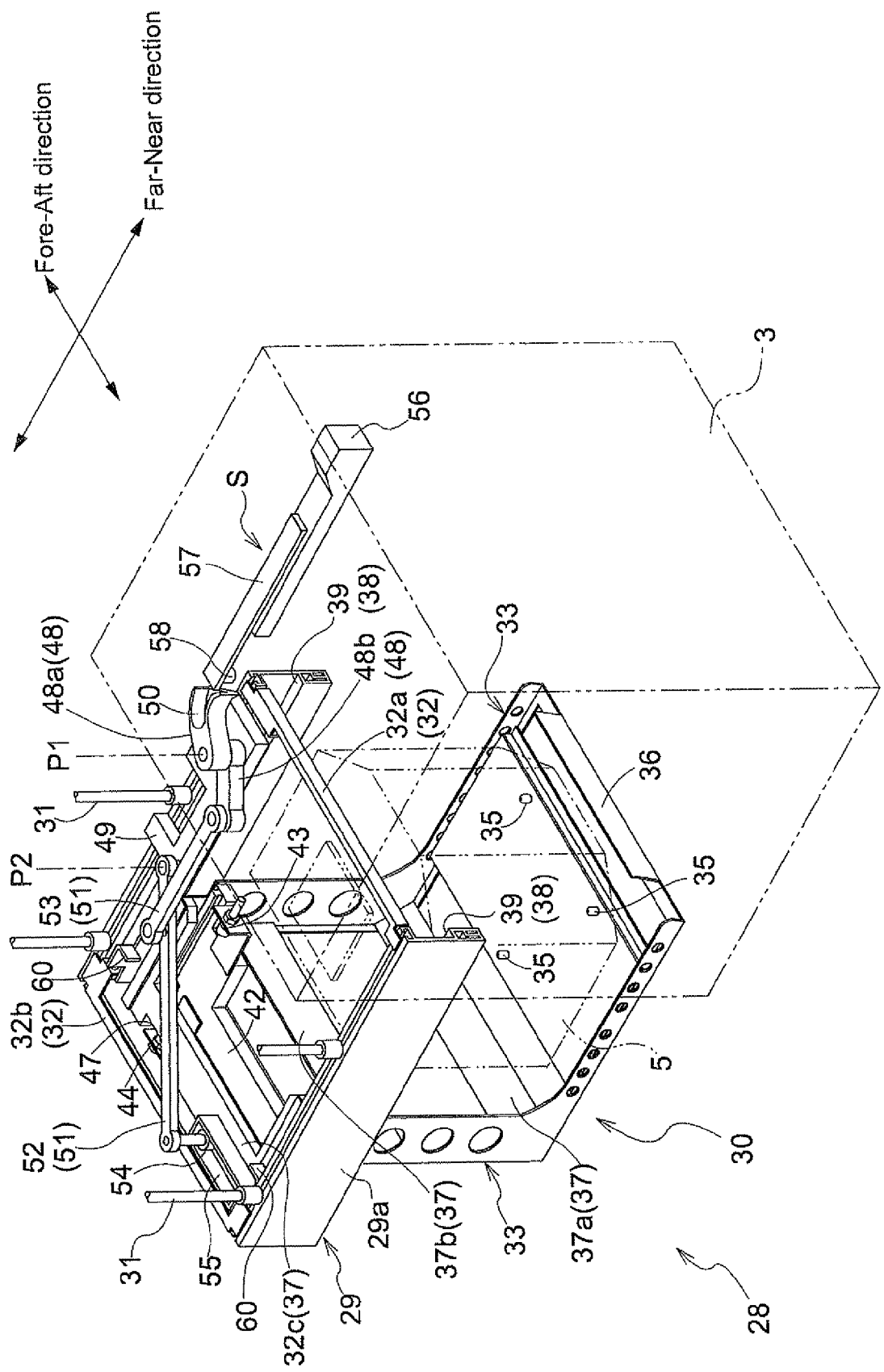
FIG. 6 is a perspective view of the article rack in a retracted position.
Figure 7:
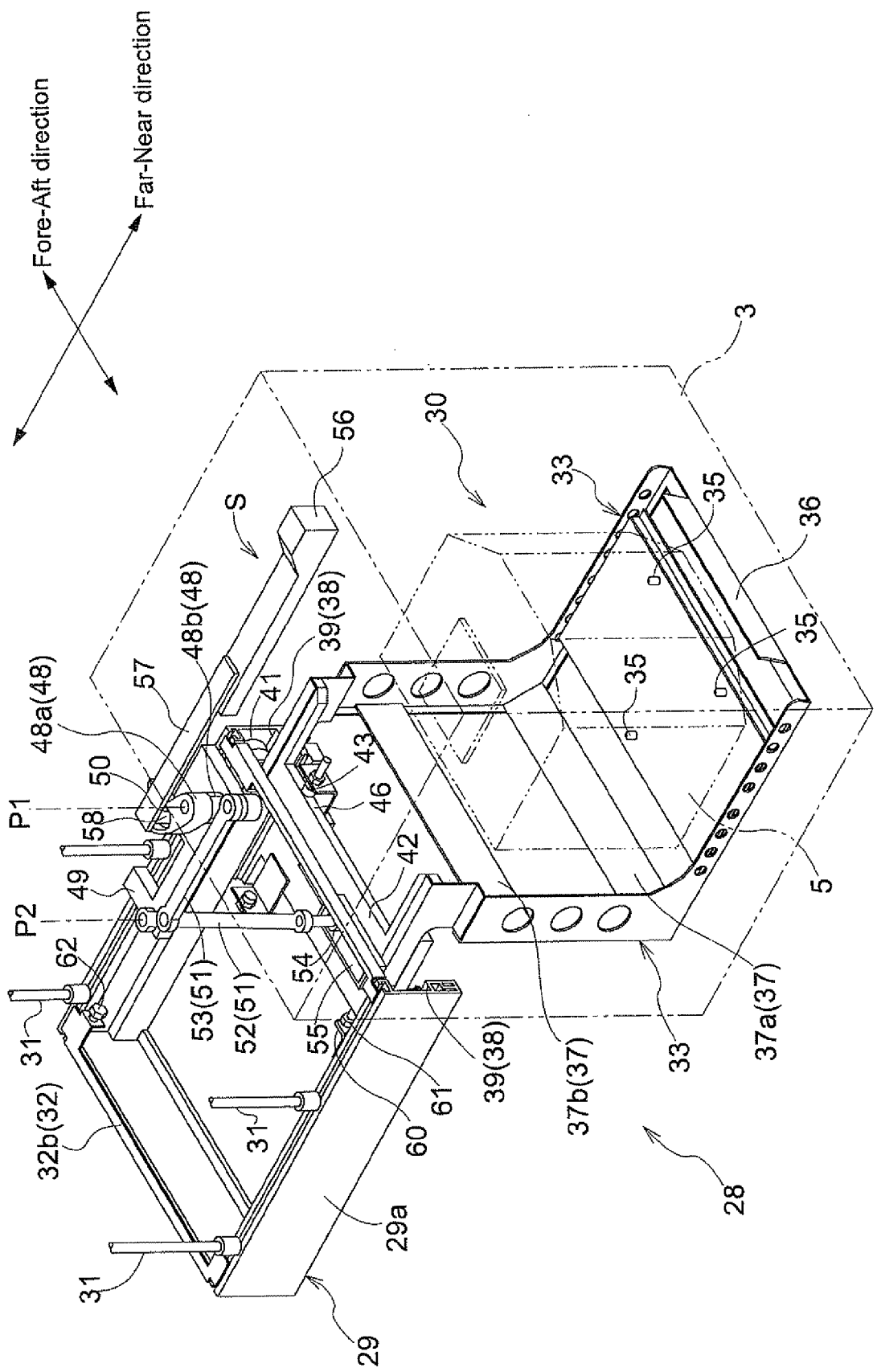
FIG. 7 is a perspective view of the article rack in an extended position.
Figure 8:
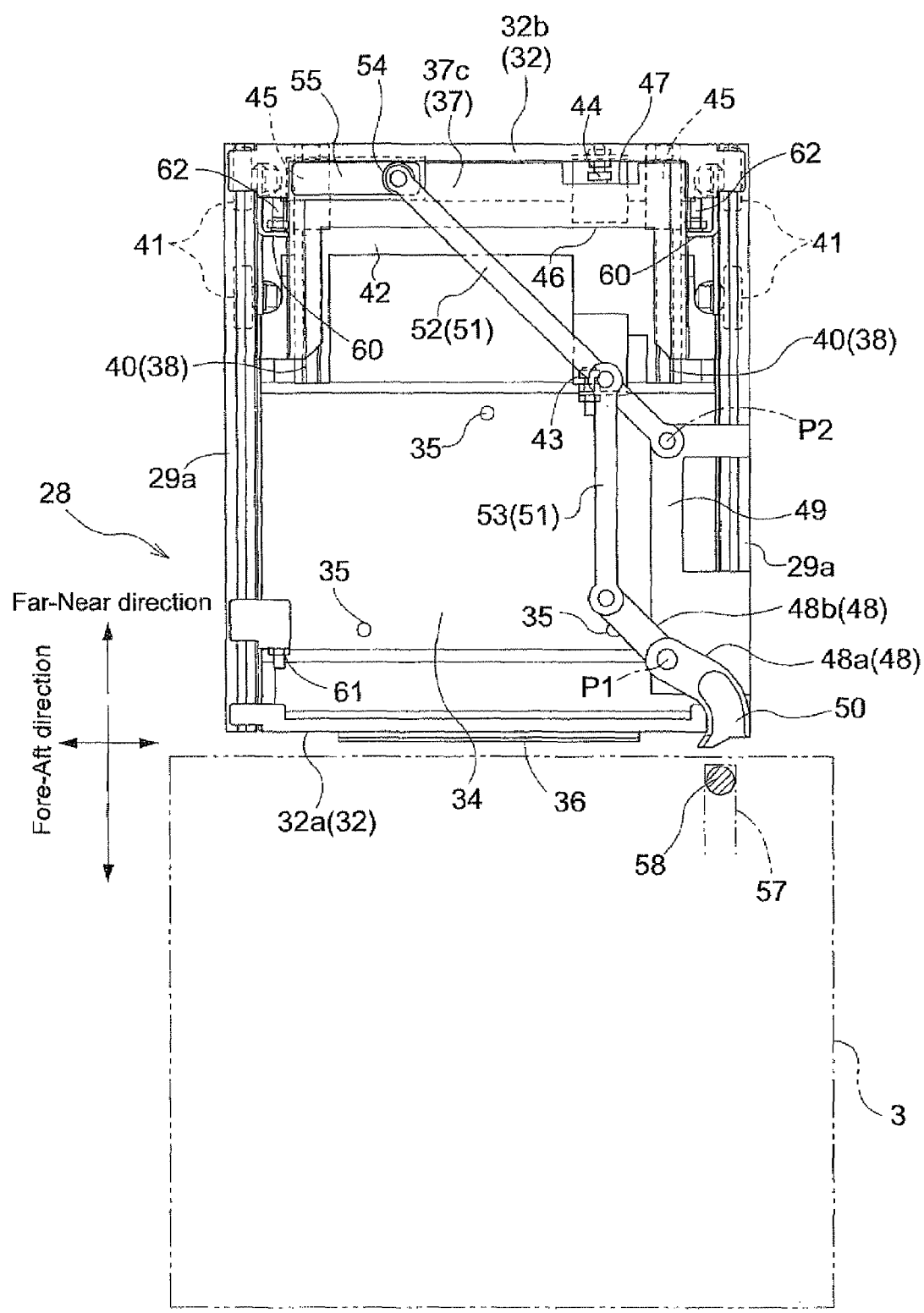
FIG. 8 is a plan view of the article rack in the retracted position.

Each of the article racks 28 is shiftable between an extended position (see FIGS. 7 and 9) projecting toward the guide rail 2 for receiving a container 5 from, and delivering a container 5 to, the gripper 4 of the transport vehicle 3 having stopped in an article transfer location corresponding thereto, and a retracted position (see FIGS. 6 and 8). The extended position of the article rack 28 means a state where a movable frame 30 of the article rack 28 is in an extended position as described hereinafter. The retracted position of the article rack 28 means a state where the movable frame 30 of the article rack 28 is in a retracted position. Thus, the shifting direction of the article rack 28 corresponds to the shifting direction of the movable frame 30.

The fore and aft direction of the transport vehicle 3 standing still in the article transfer location will hereinafter be called simply "the fore and aft direction", and the direction toward and away from the transport vehicle 3 standing still in the article transfer location simply "the direction of access".

The article transfer location is determined as corresponding to each of the article racks 28. In the fore and aft direction, the article rack 28 is formed to have a width smaller than a distance between the pair of front and rear vertical frames 22 of the transport vehicle 3. Thus, when the transport vehicle 3 stops in the article transfer location, the article rack 28 is movable into and out of the space between the pair of front and rear vertical frames 22 of the transport vehicle 3.

The retracted position is set to a side of and adjacent the guide rail 2, but away from the guide rail 2 in the direction of access, such that the article rack 28, when in the retracted position, will not itself, or the container 5 placed thereon will not, obstruct movement of the transport vehicle 3 or vertical movement of the gripper 4.

The extended position is set to a position projecting toward the guide rail 2 and vertically overlapping the gripper 4 of the transport vehicle 3 standing still in the article transfer location. Thus, when the article rack 28 is in the extended position, a container 5 can be transferred between the article rack 28 and the gripper 4 located in the position adjacent the upper position of the transport vehicle 3 standing still in the article transfer location.

Figure 5:
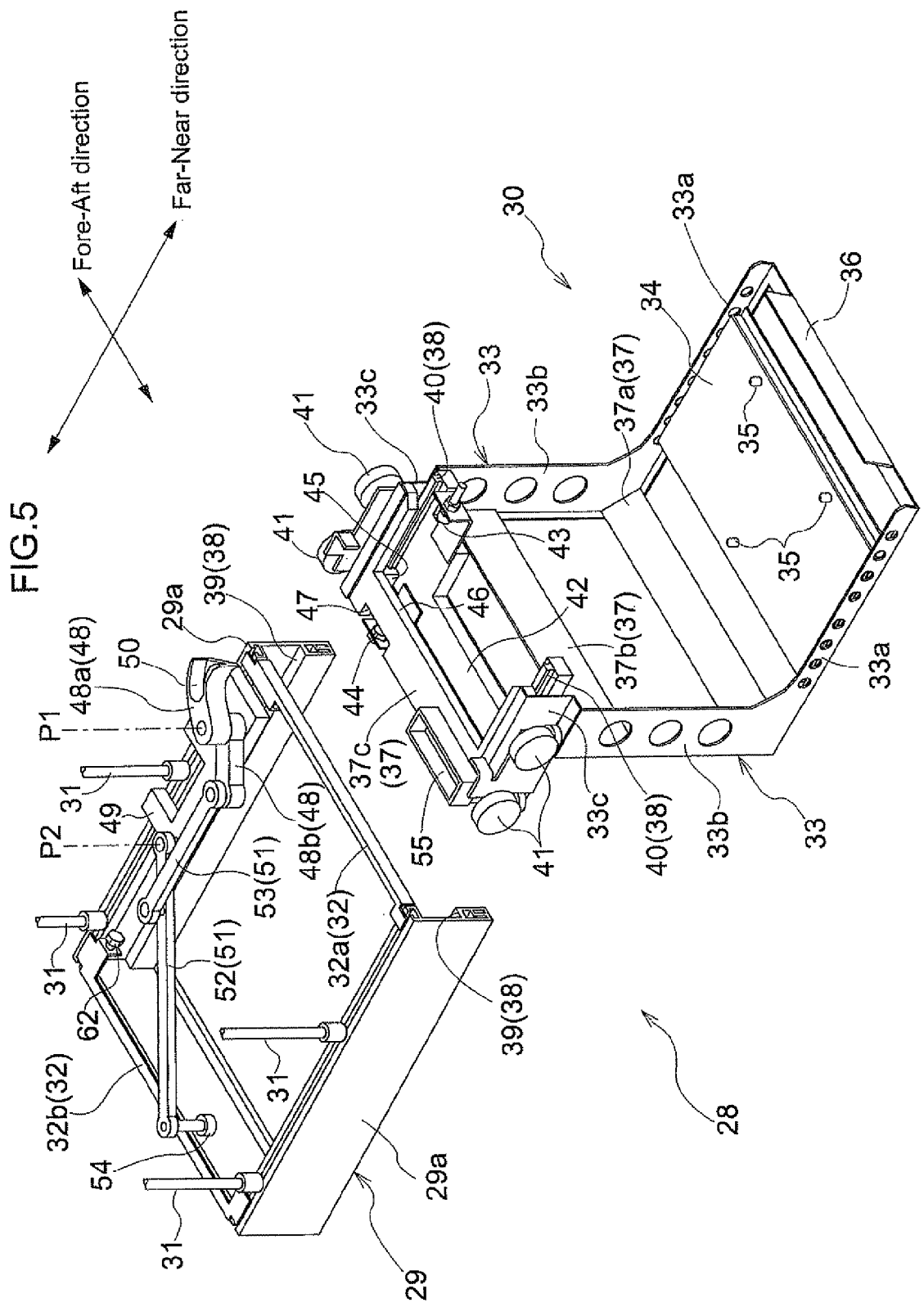
FIG. 5 is an exploded perspective view of an article rack.

As shown in FIGS. 5 through 7, each article rack 28 includes a fixed frame 29 installed on the ceiling side as corresponding to the retracted position, and the movable frame 30 supported to be movable in the direction of access relative to the fixed frame 29.

The fixed frame 29 is formed of a pair of side frame members 29a elongated in the direction of access. The fixed frame 29 is suspended from the ceiling through suspension supports 31 extending upward from the pair of side frame members 29a. The pair of side frame members 29a are interconnected by a plurality of frame connectors 32 spaced from each other in the direction of access. The frame connectors 32 includes a first frame connector 32a interconnecting the sides close, in the direction of access, to the transport vehicle 3 standing still in the article transfer location, and a second frame connector 32b interconnecting the sides remote, in the direction of access, from the transport vehicle 3 standing still in the article transfer location.

Each of the fixed frames 39 of the plurality of article racks 28 is individually supported as suspended from the ceiling, which allows each article rack 28 to be attached or detached. The article racks 28 may be added or deducted with ease.

The movable frame 30 includes a pair of right and left support arms 33 formed in a shape to extend in the direction of access, and connecting frames 34 spaced from each other in the direction of access and interconnecting the pair of right and left support arms 33.

The connecting frames 34 support a plurality of positioning pins 35 projecting therefrom for engaging engageable portions formed in the bottom of each container 5. The connecting frames 34 support the container 5 as positioned by the positioning pins 35. The connecting frames 34 have an upstanding wall portion 36 extending toward the transport vehicle 3 standing still in the article transfer location, and upward. The upstanding wall portion 36 serves to restrict movement of the container 5 toward the transport vehicle 3 standing still in the article transfer location.

The support arms 33 include lower portions 33a extending in the direction of access, intermediate portions 33b extending upward from the ends of the lower portions 33a remote from the transport vehicle 3, and upper portions 33c extending in the direction of access from the upper ends of the intermediate portions 33b.

A plurality of bores are formed in, and arranged at intervals longitudinally of, the lower portions 33a and intermediate portions 33b of the support arms 33. These bores contribute to lightening of the support arms 33.

The pair of right and left support arms 33 are interconnected not only by the connecting frames 34 but also by a plurality of coupling frames 37. The coupling frames 37 include a first coupling frame 37a interconnecting the ends of the lower portions 33a of the right and left support arms 33 remote from the transport vehicle 3 standing still in the article transfer location, a second coupling frame 37b interconnecting the intermediate portions 33b of the right and left support arms 33, and a third coupling frame 37c interconnecting the upper portions 33c of the right and left support arms 33.

Figure 9:
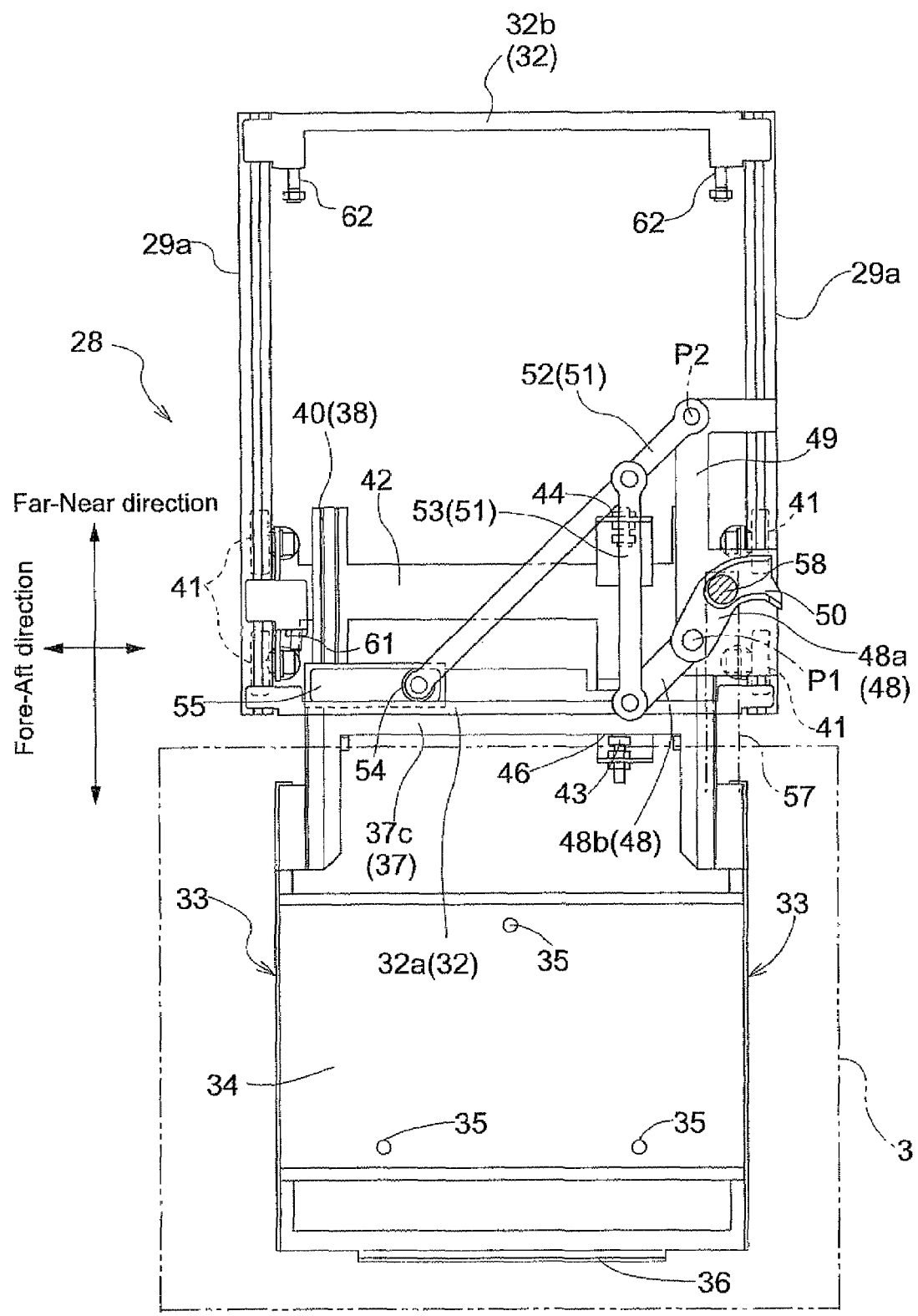
FIG. 9 is a plan view of the article rack in the extended position.

A slide guide mechanism 38 is provided for supporting the movable frame 30 to be shiftable in the direction of access relative to the fixed frame 29 between the retracted position (see FIGS. 6 and 8) and extended position (FIGS. 7 and 9).

The slide guide mechanism 38 includes rails 47 formed on the fixed frame 29, and a plurality of guide rollers 48 arranged on the support arms 35. The rails 47 are formed on the pair of side frame members 29a. The guide rollers 48 are arranged on the upper portions 35c of the support arms 35. With the rails 47 supporting and guiding the guide rollers 48, the slide guide mechanism 46 supports the movable frame 30 to be slidable relative to the fixed frame 29 between the retracted position and extended position.

The slide guide mechanism 38 includes fixed guides 39 formed on the fixed frame 29 to correspond to the retracted position of the article rack 28, and movable guides 40 arranged on the movable frame 30 to be guided by the fixed guides 39 to move in the shifting direction. The movable frame 30 is supported and guided by the movable guides 40 to be shiftable in the shifting direction of the article rack 28.

The fixed guides 39 are formed on the pair of right and left side frame members 29a, respectively, as corresponding to the retracted position of the article rack 28. The fixed guides 39 support, to be movable in the shifting direction of the movable frame 30, guide rollers 41 arranged on the movable frame 30 to be rotatable about horizontal axes. The guide rollers 41 are attached to a movable guide supporting frame 42 extending in the fore and aft direction between the pair of right and left support arms 33. Two of the guide rollers 41 are arranged, as spaced from each other in the direction of access, at each of opposite ends, in the fore and aft direction, of the movable guide supporting frame 42.

The movable guides 40 have a convex section and are attached to the movable guide supporting frame 42. The movable guides 40 are arranged right and left, and inward of the guide rollers 41 in the fore and aft direction.

Thus, the movable guide supporting frame 42 has the guide rollers 41 and movable guides 40 attached thereto. With the guide rollers 41 moving the fixed guides 39 in the shifting direction of the movable frame 30, the movable guides 40 are movable relative to the fixed guides 39 in the shifting direction of the movable frame 30.

Figure 10:
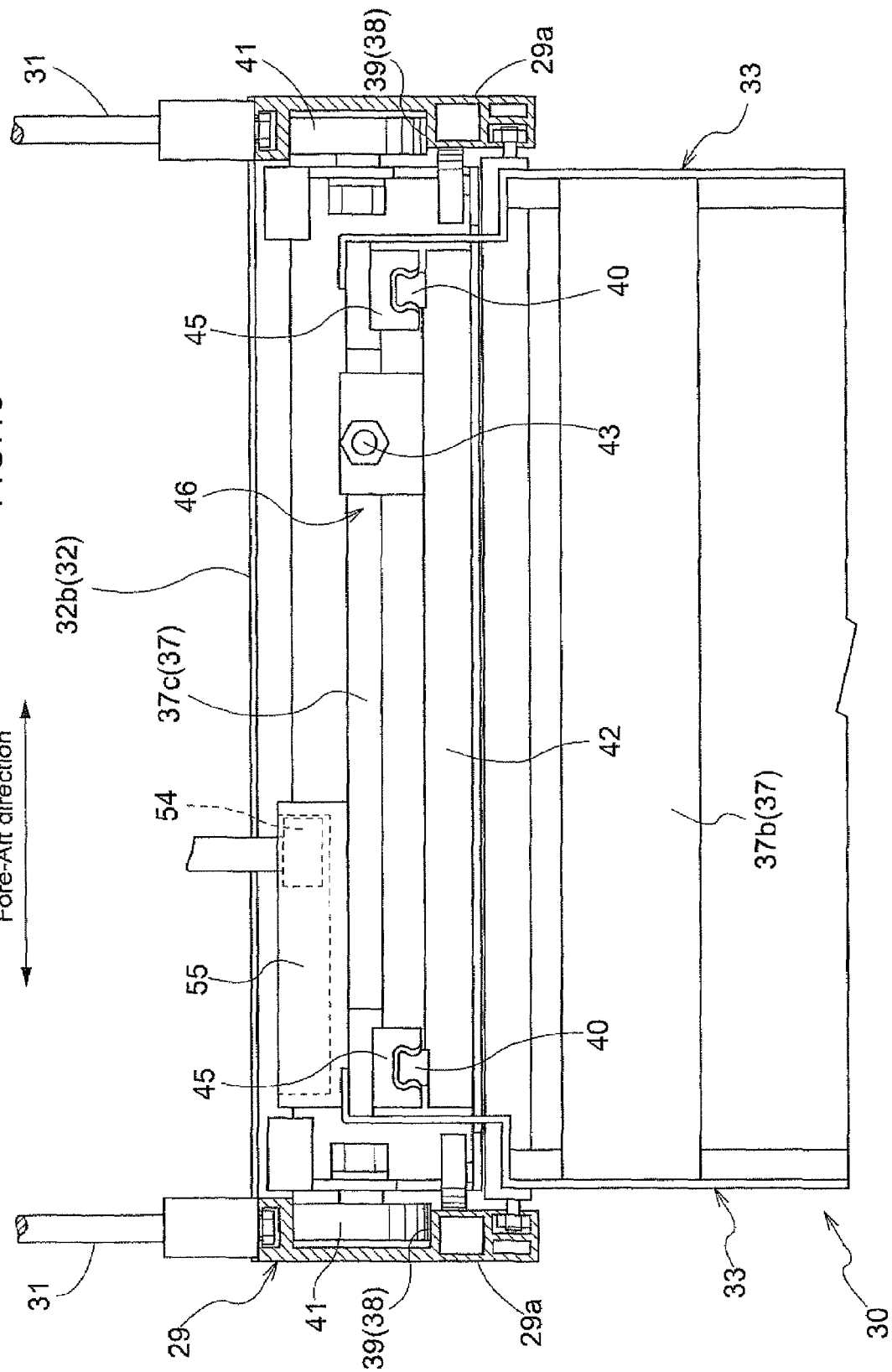
FIG. 10 is a view in vertical section of the article rack seen in a direction of access.

As shown in FIG. 10, the third coupling frame 37c interconnecting the upper portions 33c of the right and left support arms 33 has concave sliders 45 opening downward and slidably supported and guided by the convex movable guides 40. Since the movable guides 40 are provided in the right and left pair, the sliders 45 also are provided in the right and left pair. In stead of such a structure, the movable guides 40 may be shaped concave, and the sliders 45 shaped convex to correspond thereto.

With the sliders 45 slidable relative to the movable guides 40, the right and left support arms 33 are supported and guided by the movable guides 40 to be shiftable in the shifting direction of the movable frame 30. The movable frame 30 is supported and guided by the movable guides 40 to be shiftable in the shifting direction.

The movable guide supporting frame 42 has a first extended position side stopper 43 for restricting movement of the slider 45 toward the extended position relative to the movable guides 40, and a first retracted position side stopper 44 for restricting movement of the slider 45 toward the retracted position relative to the movable guides 40. On the other hand, the third coupling frame 37c has an extended position side contact portion 46 for contacting the first extended position side stopper 43, and a retracted position side contact portion 47 for contacting the first retracted position side stopper 44.

The fixed frame 29 has second extended position side stoppers 61 for contacting a pair of right and left contacted portions 60 formed on the movable guide supporting frame 42 to restrict movement of the movable guide supporting frame 42 toward the extended position relative to the fixed guides 39, and second retracted position side stoppers 62 for contacting the right and left contacted portions 60 to restrict movement of the movable guide supporting frame 42 toward the retracted position relative to the fixed guides 39.

The fixed frame 29 includes an operated element 48 supported to be movable in the direction of access between a proximate position (FIGS. 6 and 8) adjacent the transport vehicle 3 standing still in the article transfer location and a remote position (FIGS. 7 and 9) away from the transport vehicle 3.

The operated element 48 has a longitudinally intermediate part thereof pivotally connected to a base 49 provided on an upper part of one of the side frame members 29a, to be rockable about a first pivot axis P1 extending through the position of connection. The operated element 48 includes a first operated portion 48a extending from the first pivot axis P1 toward the transport vehicle 3, when in the proximate position, and a second operated portion 48b extending from the first pivot axis P1 away from the transport vehicle 3, which portions 48a and 48b are formed integral together, with a level difference therebetween.

By rocking about the first pivot axis P1, the operated element 48 switches between the proximate position and remote position. In the proximate position (FIGS. 6 and 8), the first operated portion 48a acting as a forward portion assumes a position closer than the first pivot axis P1 to the transport vehicle 3 standing still in the article transfer location. The first operated portion 48a of operated element 48 has a groove 50 formed therein to extend in a direction crossing the direction of access toward the first pivot axis P1 when the operated element 48 is located in the proximate position. The groove 50 is shaped to have an open forward end opposed to the transport vehicle 3 standing still in the article transfer location.

A linkage mechanism 51 is provided for linking movement of the operated element 48 and that of the movable frame 30. Thus, when the operated element 48 is located in the proximate position, as shown in FIGS. 6 and 8, the movable frame 30 is located in the retracted position. When the operated element 48 is located in the remote position, as shown in FIGS. 7 and 9, the movable frame 30 is located in the extended position.

The linkage mechanism 51 includes a rocking link 52 having one end (distal end) thereof engaged with the movable frame 30 of the article rack 28, and the other end (proximal end) pivotally connected to the base 49, and a connecting link 53 connecting an intermediate position of the rocking link 52 and a distal end of the second operated portion 48a of operated element 48. The rocking link 52 is operatively connected to the operated element 48 through the connecting link 53, and is rockable about a second pivot axis P2 which defines a connecting position, in the shifting direction of the article rack 28. The third coupling frame 37c interconnecting the upper portions 33c of the right and left support arms 33 has an elongate groove 55 formed therein to serve as an engaged portion extending in the fore and aft direction. The rocking link 52 has an engaging roller 54 attached to a distal end thereof and engaging the elongate groove 55.

The transport vehicle 3 includes a shift control device S for shifting the movable frame 30 of the article rack 28 between the retracted position and extended position.

The shift control device S has a base 56 fixed to the transport vehicle 3 and elongated in the direction of access, an elongate control member 57 movable in the direction of access relative to the base 56, and an engaging roller 58 acting as a control element attached to a lower surface at a forward end of the control member 57. The shift control device S has an actuator, not shown, operable to project and retract the control member 57 relative to the base 56, thereby carrying out a projecting operation and a retracting operation to move the engaging and controlling roller 58 in the direction of access.

The transport vehicle 3 includes such shift control device S for acting on the article racks 28 arranged on the right-hand side in the direction of movement of the transport vehicle 3, and a further shift control device S for acting on the article racks 28 arranged on the left-hand side.

The engaging and controlling roller 58 has a diameter corresponding to or smaller than the width of the groove 50 of the operated element 48 in the fore and aft direction. Thus, the engaging roller 58 is engageable with and disengageable from the groove 50 of the operated element 48 through movement in the direction of access.

The shift control device S is constructed the push-pull type such that, in the projecting operation, the engaging and controlling roller 58 is moved into engagement with the groove 50 to push the operated element 48 from the proximate position to the remote position, and in the retracting operation, the engaging roller 58 is retained in engagement with the groove 50 to pull the operated element 49 from the remote position to the proximate position, and thereafter the engaging roller 58 is disengaged from the groove 50.

When the shift control device S moves the operated element 48 from the proximate position to the remote position with the engaging and controlling roller 58 in the projecting operation, the operated element 48 located in the remote position will result in the article rack 28 shifted through the linkage mechanism 51 to the extended position. Thus, the article rack 28 is shifted from the retracted position to the extended position. When the shift control device S moves the operated element 48 from the remote position to the proximate position with the engaging and controlling roller 58 in the retracting operation, the operated element 48 located in the proximate position results in the article rack 28 shifted through the linkage mechanism 51 to the retracted position. Thus, the article rack 28 is shifted from the extended position to the retracted position.

Movements taking place when the article rack 28 is shifted between the retracted position and extended position will be described.

When the operated element 48 is located in the proximate position as shown in FIGS. 6 and 8, the opening of the groove 50 opens in the direction of access. The control device S executes the projecting operation to move the engaging and controlling roller 58 in the direction of access to project from the transport vehicle 3, and through the opening of the groove 50 into the groove 50 to engage the latter. As the engaging and controlling roller 58 engaging the groove 50 is further moved in the direction of access to project from the transport vehicle 3, the engaging roller 58, while pressing a side wall of the groove 50, moves through the groove 50 to push the operated element 48 from the proximate position to the remote position. As the operated element 48 rocks from the proximate position to the remote position, the rocking link 52 rocks in the shifting direction of the article rack 28 about the second pivot axis P2 while the engaging roller 54 of the rocking link 52 pushes a side wall of the elongate groove 55 toward the extended position of the article rack 28. The rocking of the rocking link 52 pushes the third coupling frame 37c toward the extended position of the article rack 28, to move the movable guides 40 relative to the fixed guides 39 toward the extended position of the article rack 28, and move the right and left support arms 33 relative to the movable guides 40 toward the extended position of the article rack 28, thereby shifting the article rack 28 to the extended position.

The movement of the movable guides 40 relative to the fixed guides 39, and the movement of the right and left support arms 33 relative to the movable guides 40, will be described further.

Figure 11:
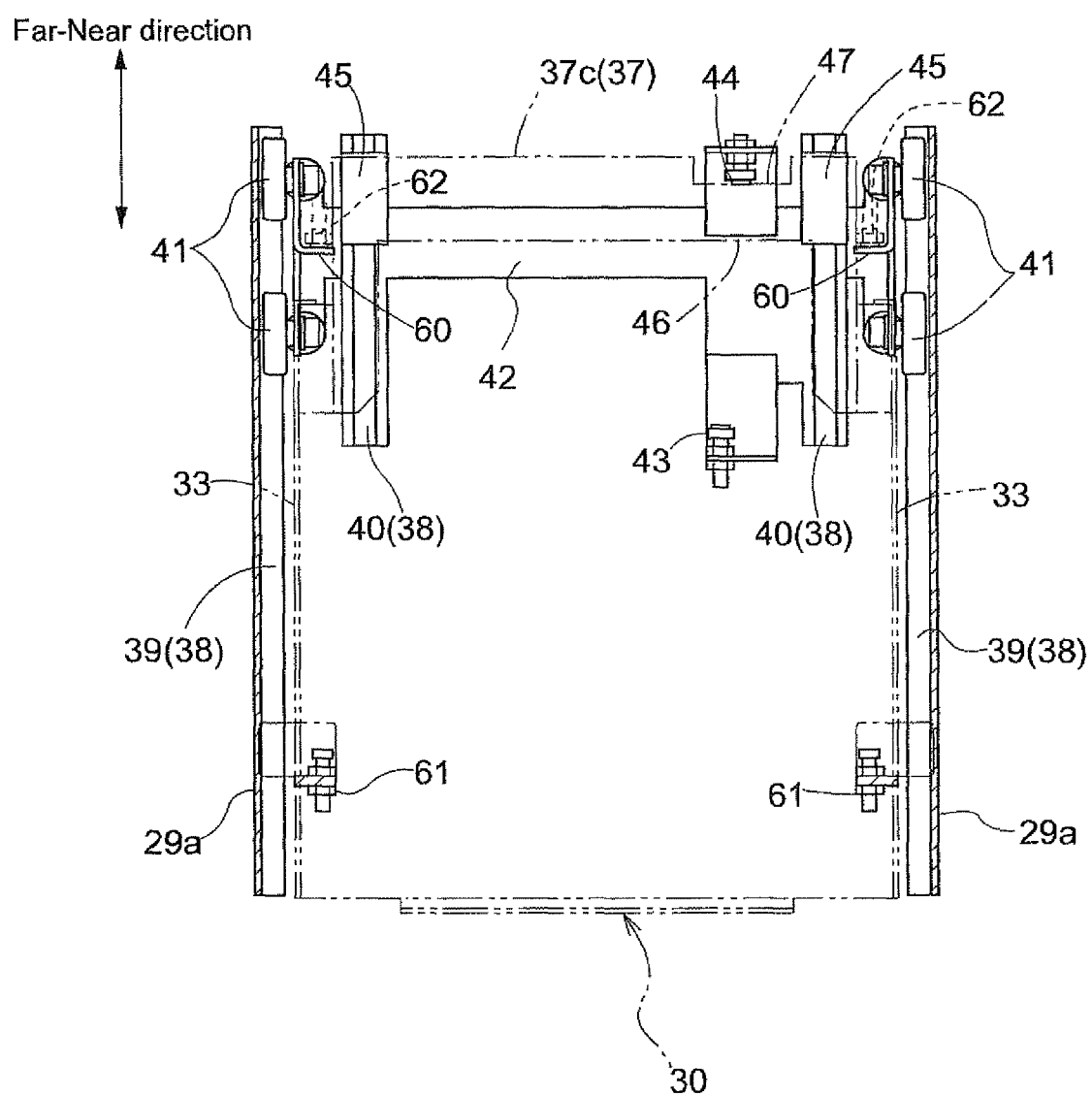
FIG. 11 is a plan view of a principal portion of the article rack.

As shown in FIG. 11, when the article rack 28 is located in the retracted position, the guide rollers 41 are located on remote portions in the direction of access of the fixed guides 39, and the sliders 45 are located on remote portions in the fore and aft direction of the movable guides 40. At this time, the first retracted position side stopper 44 contacts the retracted position side contact portion 47, and the second retracted position side stoppers 62 contact the contacted portions 60. This restricts movement of the movable guides 40 relative to the fixed guides 39 toward the extended position, and movement, relative to the movable guides 40 toward the extended position, of the third coupling frame 37c interconnecting the right and left support arms 33.

Figure 12:
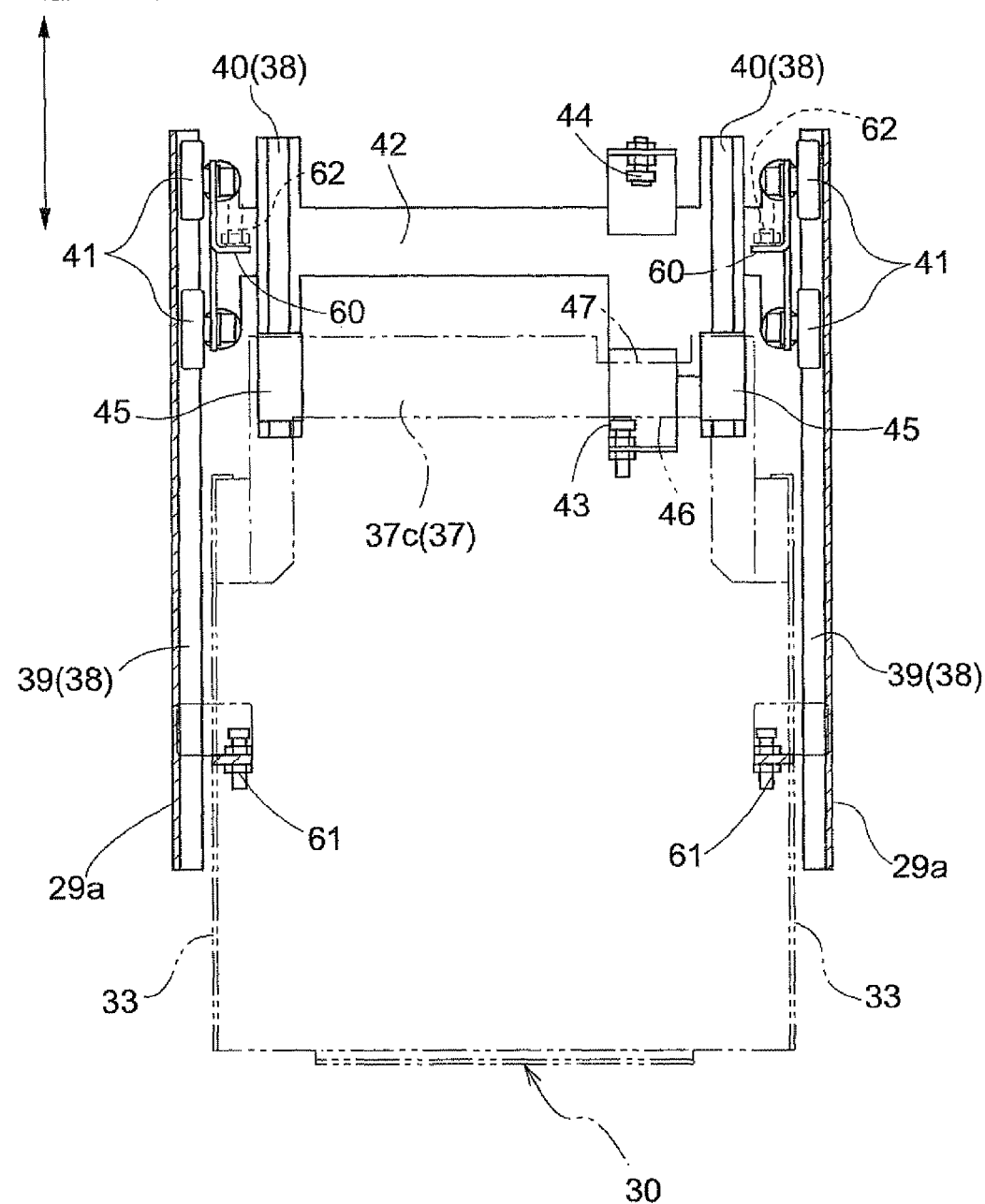
FIG. 12 is a plan view of a principal portion of the article rack.

When the third coupling frame 37c is pressed by rocking of the rocking link 52 toward the extended position of the article rack 28, the sliders 45 slide along the movable guides 40 toward the proximate position in the direction of access. As shown in FIG. 12, the first extended position side stopper 43 contacts the extended position side contact portion 46 to restrict movement of the third coupling frame 37c relative to the movable guides 40 toward the extended position. Thereafter the third coupling frame 37c and movable guides 40 move together, with the guide rollers 41 supported and guided by the fixed guides 39, whereby the third coupling frame 37c continues moving toward the extended position. In this way, the movable guides 40 move relative to the fixed guides 39 toward the extended position in the shifting direction of the article rack 28, and the right and left support arms 33 move relative to the movable guides 40 toward the extended position in the shifting direction of the article rack 28. Consequently, as shown in FIG. 13, the article rack 28 is projected from the retracted position to the extended position. At this time, the first extended position side stopper 43 contacts the extended position side contact portion 46, and the second extended position side stoppers 61 contact the contacted portions 60, to restrict movement of the movable guides 40 relative to the fixed guides 39 toward the extended position, and movement of the third coupling frame 37c relative to the movable guides 40 toward the extended position.

When the control device S executes the retracting operation, with the operated element 48 located in the remote position as shown in FIGS. 7 and 9, the engaging and controlling roller 58 will move toward the transport vehicle 3 while engaging the groove 50. The engaging and controlling roller 58 moves through the groove 50 while pressing a side wall of the groove 50, to pull the operated element 48 from the remote position to the proximate position. As the operated element 48 rocks from the remote position to the proximate position, the rocking link 52 rocks in the shifting direction of the article rack 28 about the second pivot axis P2 while the engaging roller 54 of the rocking link 52 pushes a side wall of the elongate groove 55 toward the retracted position of the article rack 28. The rocking of the rocking link 52 pushes the third coupling frame 37c toward the retracted position of the article rack 28, to move the movable guides 40 relative to the fixed guides 39 toward the retracted position of the article rack 28, and move the right and left support arms 33 relative to the movable guides 40 toward the retracted position of the article rack 28, thereby shifting the article rack 28 to the retracted position. When the operated element 48 is located in the proximate position as shown in FIGS. 6 and 8, the opening of the groove 50 opens in the direction of access. Thus, the engaging and controlling roller 58 moving toward the transport vehicle 3 will become disengaged from the groove 50 and retract to the transport vehicle 3.

Movement of the movable guides 40 relative to the fixed guides 39 and movement of the right and left support arms 33 relative to the movable guides 40 taking place when shifting the article rack 28 from the extended position to the retracted position, are the reverse of the movements taking place when shifting the article rack 28 from the retracted position to the extended position, and will not be described.

The transport vehicle 3 includes a carriage controller for controlling operation of the transport vehicle 3. Based on commands from a supervising computer that controls operation of the entire article transport facility, and on detection information from various sensors provided on the transport vehicle 3, the carriage controller controls movement of the transport vehicle 3, lifting operation of the gripper 4, operation of the gripping motor 27, and operation of the shift control device S.

When, for example, the supervising computer gives a transport command indicating a transport starting and destination stations 7 among the plurality of stations 7, and instructing an operation to transport a container 5 from the starting station 7 to the destination station 7, the carriage controller controls operation of the transport vehicle 3 to receive the container 5 from the starting station 7, and deliver the container 5 to the destination station 7. The controller and computer per se are known, and have hardware such as CPUs, memories and communication circuits, and algorithms (programs) for performing the functions described in this specification.

When receiving the container 5 from the starting station 7, the carriage controller first controls movement of the transport vehicle 3 to stop the transport vehicle 3 in a stopping position corresponding to the starting station 7. Next, with the transport vehicle 3 standing still in the stopping position corresponding to the starting station 7, the carriage controller performs lift control of the gripper 4 to lower the gripper 4 from the upper position to the lower position. When the gripper 4 is located in the lower position, the carriage controller operates the gripping motor 27 to switch the pair of gripping elements 4a to the gripping position, whereby the gripping elements 4a grip the flange 5a of the container 5. The container 5 is received in this way. Subsequently, the carriage controller performs lift control of the gripper 4 to raise the gripper 4 from the lower position to the upper position. Then, the carriage controller controls movement of the transport vehicle 3 to stop the transport vehicle 3 in a stopping position corresponding to the destination station 7.

When the transport vehicle 3 has stopped in the stopping position corresponding to the destination station 7, the carriage controller delivers the container 5 to the destination station 7 by lift control of the gripper 4 and operation of the gripping motor 27, as performed when receiving the container 5 from the starting station 7.

The supervising computer may give a storage command indicating one of the plurality of article racks 28, and instructing an operation to store a container 5 on the indicated article rack 28. Such a case will be described hereinafter.

The carriage controller first controls movement of the transport vehicle 3 to move the transport vehicle 3 to an article transfer location corresponding to the article rack 28 for transfer. Next, with the transport vehicle 3 standing still in the article transfer location corresponding to the article rack 28 for transfer, the carriage controller causes the shift control device S to execute the projecting operation. In the projecting operation of the shift control device S, the article rack 28 is shifted from the retracted position to the extended position. After performing lift control of the gripper 4 to lower the gripper 4 from the upper position to a position adjacent the article rack 28, the carriage controller operates the gripping motor 27 to switch the pair of gripping elements 4a to the release position, thereby delivering the container 5 from the gripper 4 to the article rack 28 located in the extended position. Then, after performing lift control of the gripper 4 to raise the gripper 4 to the upper position, the carriage controller causes the shift control devise S to execute the retracting operation. In the retracting operation of the shift control device S, the article rack 28 is shifted from the extended position to the retracted position.

The supervising computer may give a fetch command indicating one of the plurality of article racks 28, and instructing an operation to fetch a container 5 from the indicated article rack 28. Such a case will be described hereinafter.

The carriage controller controls movement of the transport vehicle 3, as in the case of the storage command, to stop the transport vehicle 3 in an article transfer location corresponding to the article rack 28 for transfer. Then, the carriage controller causes the shift control devise S to execute the projecting operation, thereby shifting the article rack 28 from the retracted position to the extended position. After performing lift control of the gripper 4 to lower the gripper 4 from the upper position to a position adjacent the article rack 28, the carriage controller operates the gripping motor 27 to switch the pair of gripping elements 4a to the gripping position, thereby receiving the container 5 from the article rack 28. Then, after performing lift control of the gripper 4 to raise the gripper 4 to the upper position, the carriage controller causes the shift control devise S to execute the retracting operation. In the retracting operation of the shift control device S, the article rack 28 is shifted from the extended position to the retracted position.

Other Embodiments (1) In the embodiment described hereinbefore, the shift control device S is mounted on the transport vehicle 3. Instead, the shift control device may be provided for the article rack 28.

(2) In the embodiment described hereinbefore, the engaging roller 54 at the distal end of the rocking link 52 is in slidable engagement with the elongate groove 55 formed in the third coupling frame 37c. Instead, for example, the distal end of the rocking link 52 may be pivotally connected to the third coupling frame 37c.

(3) In the embodiment described hereinbefore, each article rack 28 in the extended position transfers a container 5 to and from the gripper 4 located in a position close to the upper position. The vertical position for transferring a container between the article rack 28 in the extended position and the gripper 4 is not limited to a position close to the upper position or the upper position. This position may be lower by a set height than the upper position. In this case, a container 5 may be transferred between the article rack 28 and gripper 4 by lowering the gripper 4 by the set height from the upper position in the state of the article rack 28 being located in the extended position.

(4) In the embodiment described hereinbefore, a plurality of article racks 28 are arranged along the guide rail 2. The number of article racks 28 may be varied as appropriate. While the article racks 28 are installed at both sides of the guide rail 2, they may be installed only at one side of the guide rail 2.

(5) In the embodiment described hereinbefore, the transport vehicle 3 has two shift control devices S, i.e. the shift control device S for shifting the article racks 28 arranged at the right-hand side in the direction of movement of the transport vehicle 3, and the shift control device S for shifting the article racks 28 arranged at the left-hand side in the direction of movement of the transport vehicle 3. For example, the transport vehicle 3 may have one shift control device S with the engaging and controlling roller 58 movable to project rightward and leftward from the transport vehicle 3.

(6) In the embodiment described hereinbefore, the article transport facility transports, as articles, containers 5 storing semiconductor substrates. The articles transported may be varied as appropriate.

What is claimed is:

1. An article transport facility comprising:
   an article carrier movable along a track;
   an article rack arranged along said track, said article rack having a fixed frame, and a movable frame supported to be movable relative to said fixed frame between an extended position projecting toward said track and a retracted position retracted away from said track;
   said article carrier being configured to stop in an article transfer location for said article rack and to deliver an article to and receive an article from said article rack when said movable frame is in said extended position;
   a movable guide for shiftably supporting and guiding said movable frame to allow said movable frame to be movable relative to the moveable guide in a shifting direction; and
   a fixed guide mounted on said fixed frame for supporting and guiding said movable guide to allow said movable guide to be movable relative to the fixed guide in said shifting direction,
   wherein said movable guide comprises an extended position side limiting portion and a retracted position side limiting portion, the extended position side limiting portion coming into contact with said movable frame located in the extended position for limiting movement of said moveable frame toward the extended position relative to said movable guide, the retracted position side limiting portion coming into contact with said movable frame located in the retracted position for limiting movement of said movable frame toward the retracted position relative to said movable guide.

2. An article transport facility as defined in claim 1, further comprising a shift control device mounted on said article carrier for shifting said movable frame between said extended position and said retracted position when said article carrier is in said article transfer location.

3. An article transport facility as defined in claim 2, further comprising:
   an operated element rockable about a pivot axis to switch between a proximate position close to said article carrier in said article transfer location and a remote position remote from said article carrier in said article transfer location;
   said shift control device has an operating element movable away from said article carrier to switch said operated element from said proximate position to said remote position, and movable back toward said article carrier to switch said operated element from said remote position to said proximate position; and
   a rocking link operatively connected to said operated element and rockable in said shifting direction of said movable frame about a rocking axis such that said movable frame is in said retracted position when said operated element is in said proximate position, and said movable frame is in said extended position when said operated element is in said remote position;
   said rocking link having an engaging portion in slidable engagement with an engaged portion formed in said article rack and extending in a direction perpendicular to said shifting direction.

4. An article transport facility as defined in claim 1, wherein said article carrier is movable along said track disposed above said article racks, and includes an article holder vertically movable to deliver an article to and receive an article from said article rack.

5. An article transport facility as defined in claim 1, wherein said movable guide is engaged with a slide member connected to said movable frame, one of said movable guide and said slide member having a recessed section, and the other of said movable guide and said slide member having a projecting section.

6. An article transport facility comprising:
   a transport vehicle movable along a rail suspended from a ceiling;
   a drum supported by said transport vehicle for winding up a flexible member;
   a motor for rotating said drum;
   a gripper suspended from said transport vehicle through said flexible member;
   an article rack arranged adjacent said rail, said article rack having a fixed frame, and a movable frame movable in a predetermined direction between a first position and a second position spaced from said first position, wherein said article rack is configured to receive an article from said gripper when said movable frame is in said second position;
   a movable guide for supporting said movable frame in such a way to allow said movable frame to move in said predetermined direction relative to said movable guide; and
   a fixed guide mounted on said fixed frame for supporting said movable guide in such a way to allow said movable guide to move in said predetermined direction relative to said fixed guide,
   wherein said movable guide comprises a second position side limiting portion and a first position side limiting portion, the second position side limiting portion coming into contact with said movable frame located in the second position for limiting movement of said moveable frame toward the second position relative to said movable guide, the first position side limiting portion coming into contact with said movable frame located in the first position for limiting movement of said movable frame toward the first position relative to said movable guide.

7. An article transport facility as defined in claim 6, further comprising a control member provided to said transport vehicle for moving said movable frame from said first position to said second position.

8. An article transport facility as defined in claim 7, further comprising:
   an operated element rockable about a pivot axis to switch between a proximate position close to said transport vehicle standing still in said article transfer location and a remote position remote from said transport vehicle in said article transfer location, wherein said control device is movable away from said transport vehicle to switch said operated element from said proximate position to said remote position, and movable toward said transport vehicle to switch said operated element from said remote position to said proximate position;
   a rocking link operatively connected to said operated element such that said movable frame is in said first position when said operated element is in said proximate position, and said movable frame is in said second position when said operated element is in said remote position, said rocking link being rockable about a rocking axis; and
   an engaging element attached to said rocking link and in slidable engagement with an engaged portion formed in said article rack and extending in a direction perpendicular to said shifting direction.

9. An article transport facility as defined in claim 6, wherein said movable guide is engaged with a slide member connected to said movable frame, one of said movable guide and said slide member having a recessed section, and the other of said movable guide and said slide member having a mating projecting section.

* * * * *